United States Patent [19]

Watabe et al.

[11] Patent Number: 5,394,354

[45] Date of Patent: Feb. 28, 1995

[54] SEMICONDUCTOR MEMORY AND ITS LAYOUT DESIGN

[75] Inventors: Akihiro Watabe, Nara; Hisashi Kodama, Osaka, both of Japan

[73] Assignee: Matsushita Electric Industrial Co., Ltd., Osaka, Japan

[21] Appl. No.: 170,788

[22] Filed: Dec. 21, 1993

[30] Foreign Application Priority Data

Dec. 21, 1992 [JP] Japan ............................... 4-340031

[51] Int. Cl.6 ............................................. G11C 11/21
[52] U.S. Cl. ...................................... 365/51; 365/149; 365/205; 365/207
[58] Field of Search ............... 365/51, 205, 207, 203, 365/149, 233.5

[56] References Cited

U.S. PATENT DOCUMENTS

| | | | |
|---|---|---|---|
| 4,156,939 | 5/1979 | Takemae et al. | 365/149 X |
| 4,491,936 | 1/1985 | Eaton, Jr. et al. | 365/149 |
| 5,008,858 | 4/1991 | Ikeda | 365/233.5 |
| 5,257,232 | 10/1993 | Dhong et al. | 365/203 |

FOREIGN PATENT DOCUMENTS

| | | |
|---|---|---|
| 54-5337 | 1/1979 | Japan . |
| 54-58321 | 5/1979 | Japan . |
| 55-32295 | 3/1980 | Japan . |
| 58-35792 | 3/1983 | Japan . |
| 60-212893 | 10/1985 | Japan . |

*Primary Examiner*—Do Hyun Yoo
*Attorney, Agent, or Firm*—Willian Brinks Hofer Gilson & Lione

[57] ABSTRACT

Each of two bit lines in a pairing relationship and a word line transition detection signal line bear the same adjunctive capacitance, since connection points provided on plural memory cells establishing connections to each of the bit lines and connection points provided on plural word line transition detection circuits establishing connections to the word line transition detection signal line are laid out into the same form. Each of the memory cells contains a data storage, a first N-channel MOS transistor, and a second N-channel MOS transistor, the data storage being connected to the bit lines through the first and second N-channel MOS transistors. Each of the word line transition detection circuits includes a third N-channel MOS transistor and a fourth N-channel transistor, these transistors being sandwiched between the word line transition detection signal line and the ground. This word line transition detection circuit detects a word line voltage transition, thereby delivering an enable signal to a sense amplifier. The sense amplifier amplifies an electric potential difference between the bit lines on receipt of the enable signal. The third transistor has the same dimensions as the first and second transistors. The gate width of the fourth transistor is set greater than the gate width of MOS transistors forming the data storage.

8 Claims, 3 Drawing Sheets

F I G. 2
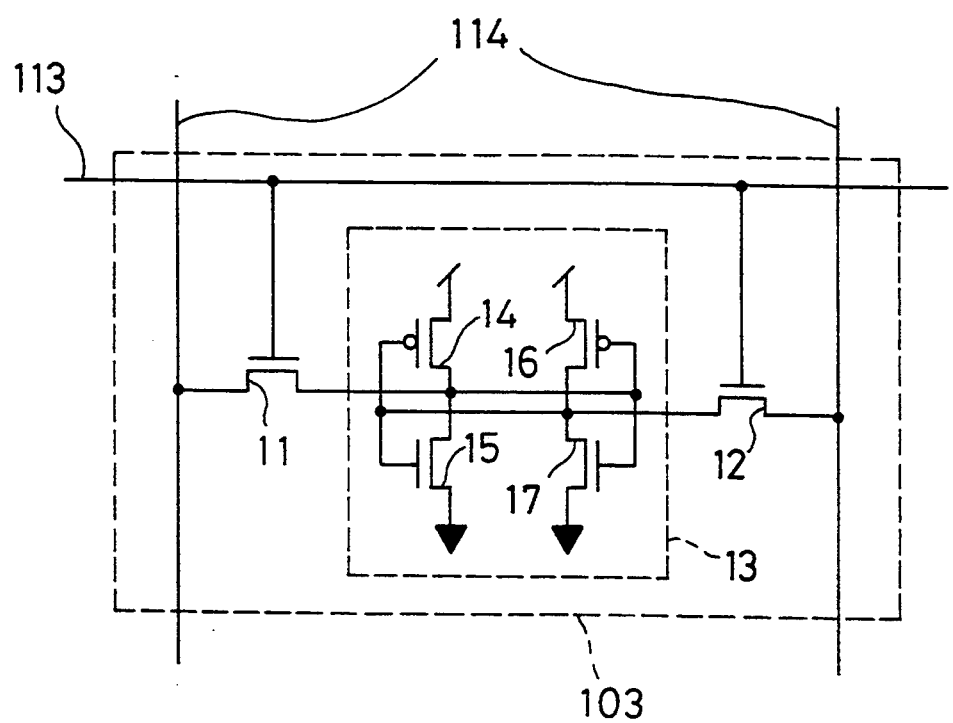

ns and to a semiconductor memory layout design technique.

SEMICONDUCTOR MEMORY AND ITS LAYOUT DESIGN

BACKGROUND OF THE INVENTION

This invention generally relates to a semiconductor memory organization that requires less layout design step count, and to a semiconductor memory layout design technique.

There are semiconductor memories known as SRAMs (static random-access memories). Some SRAMs adopt a sense amplifier organization to achieve a high-speed data readout performance, wherein a word line transition detection circuit detects a change of the word line voltage and sends out an enable signal to a sense amplifier according to the result of the detecting operation. If one word line is selected, a memory cell connected to the selected word line is read. Data, stored in that memory cell, is transferred to a pair of bit lines. Concurrently with this, a word line transition detection signal line is driven to report such a word line selection. On the basis of a signal received on the detection signal line, a sense enable signal generation circuit generates a sense enable signal. As soon as a stored-data dependent potential difference occurs between the bit lines, a sense amplifier amplifies such a difference.

The timing of sense enable must be optimized to the timing of data readout from a memory cell. If the sense enable timing is too fast, wrong data is provided. If it is too slow, fast data readout is impossible. Therefore, the delay time of the sense enable signal generation circuit is determined to obtain the best sense enable timing. For the case of usual SRAMs, the parasitic capacitance (unwanted adjunct) of each bit line and the parasitic capacitance of a word line transition detection signal line differ from each other. Accordingly, the difference between the elapsed time from word line selection to potential difference occurrence and the elapsed time from word line selection to sense enable signal generation must be "absorbed" within a sense enable signal generation circuit.

The specification change may involve the memory capacity change (i.e., the word count change). Deviations from the best sense enable timing cannot be avoided by changing only the memory cell count and the word line transition detection circuit count. This is because that the parasitic capacitance of each bit line does not vary with that of a word line transition detection signal line. Conventionally, the organization of sense enable signal generation circuits must be redesigned, when the layout design is required due to the specification change, to correct the timing of sense enable.

Recent development in computer-aided-design (CAD) is remarkable. For example, SRAM layout design uses a CAD program called a memory generator according to which an SRAM is divided into plural circuit blocks such as memory cells and sense amplifiers. Plural leaf cells holding internal organization descriptions of the circuit blocks are provided. The SRAM layout design is made by arranging the number of leaf cells corresponding to a given memory capacity.

If an attempt is made to use a memory generator in layout-designing the above-described SRAM adopting a sense amplifier organization, this requires the provision of leaf cells for sense enable signal generation circuits of several different types having different delay times. Of all the leaf cells one leaf cell suitable for a given memory capacity is selected. The organization of the selected one must be corrected fully. This produces such problems that the amount of leaf cell data increases, that memory generator programs become complicated, and that memory development degradation occurs.

DISCLOSURE OF THE INVENTION

It is an object of the present invention to increase the efficiency of the semiconductor memory development.

According to the present invention, each of two bit lines in a pairing relationship and a word line transition detection signal line are so designed that they bear the same parasitic capacitance. This is achieved by laying out connection points provided on plural memory cells establishing connections to the bit lines and connection points provided on plural word line transition detection circuits establishing connections to the word line transition detection signal line into the same form.

More specifically, each memory cell contains a first MOS transistor, a second MOS transistor, and a data storage. The first transistor has a gate connected to an associated word line and a drain connected to one of the bit lines, whereas the second transistor has a gate connected to the same word line as the first transistor's gate and a drain connected to the other of the bit lines. The data storage is sandwiched between sources of the first and second transistors. If an associated word line is selected, both the first and second transistors of the memory cell are turned on and the data storage starts outputting data to the bit lines.

Each word line transition detection circuit has a third MOS transistor and a fourth MOS transistor. The third transistor has a gate connected to an associated word line and a drain connected to the word line transition detection signal line. The fourth transistor has a gate connected to the same word line as the third transistor's gate, a drain connected to a source of the third transistor, and a source connected to the ground. Additionally, the third transistor has the same dimensions as the first and second transistors so that each of the bit lines and the word line transition detection signal line bear the same adjunctive capacitance (i.e., the same parasitic capacitance). If one word line is selected, the third and fourth transistors connected to the selected word line are turned on. The word line transition detection signal line starts to be discharged for generation of a sense enable signal.

Because of such an arrangement, each of the bit lines and the word line transition detection signal line always have the same parasitic capacitance; that is, the variation in capacitance of each of the bit lines and the variation in capacitance of the word line transition detection signal line, caused by the change in memory capacitance (i.e., the change in word count), are the same. Unlike conventional techniques, the present invention requires no sense enable timing correction in changing the specification. Therefore, the amount of leaf cell data in the case of using a memory generator decreases and memory generator programs can be simplified. The present invention therefore can adapt itself to the change in specification. This increases the efficiency of the memory development and produces practical benefits.

Preferably, the fourth MOS transistor is given a greater gate width than transistors forming a data storage so that the driving capability of the fourth transistor is higher than that of the data storage. This enables high-speed drive of the word line transition detection signal line compared to the speed of readout to the bit lines, without affecting the balance of the parasitic capacitance of the word line transition detection signal line to that of each bit line. The best sense enable timing can be realized easily.

BRIEF DESCRIPTION OF THE DRAWINGS

In the accompanying drawings in which:

FIG. 2 is a circuit diagram illustrating in detail the internal organization of one memory cell of FIG. 1.

PREFERRED EMBODIMENT OF THE INVENTION

Referring now to the accompanying drawings, a semiconductor memory, that is, an SRAM of the invention is described together with its layout design technique.

Figure 1:
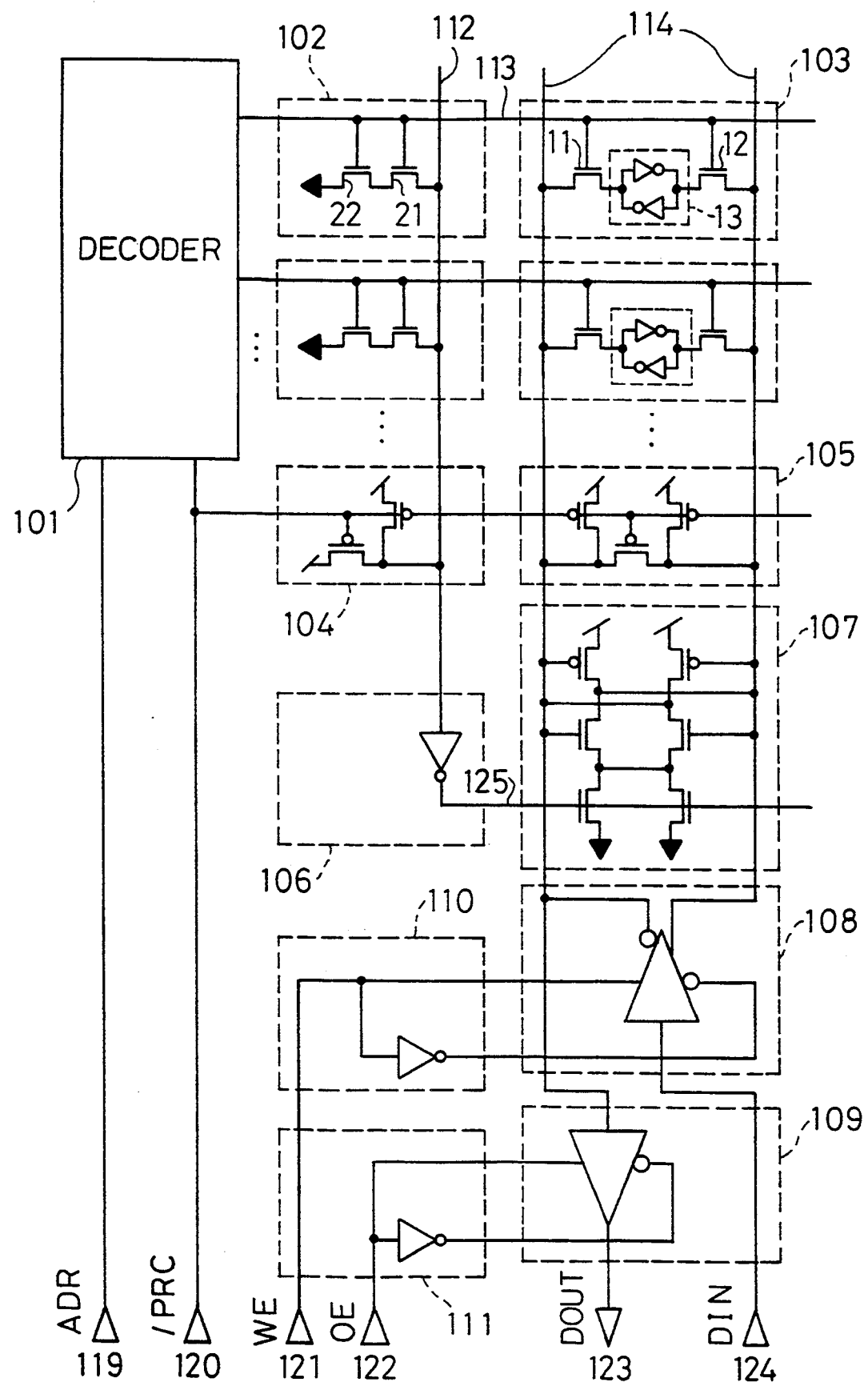
FIG. 1 is a circuit diagram schematically illustrating the organization of a semiconductor memory of a preferred embodiment of the invention.

An SRAM of FIG. 1 has the following lines: N word lines 113; a pair of bit lines 114; and a single word line transition detection signal line 112 (hereinafter called the WLTD signal line). This SRAM further includes the following components: a decoder 101; N word line transition detection circuits 102 (hereinafter called the WLTD circuits); N memory cells 103; a word line transition detection signal line precharge circuit 104 (the WLTDSL precharge circuit); a bit line precharge circuit 105 (the BL precharge circuit); a sense enable signal generation circuit 106 (the SESG circuit); a sense amplifier 107; a write buffer 108, a read buffer 109; a write buffer control circuit 110; and a read buffer control circuit 111.

An address (ADR), input at an address input terminal 119, is applied to the decoder 101. A precharge signal (/PRC), input at a precharge signal input terminal 120, is also applied to the decoder 101. If the precharge signal is in the LOW state, all the word lines 113 are discharged by the decoder 101 to the LOW state. If the precharge signal enters the HIGH state, the decoder 101 decodes an input address to select one of the N word lines 113 according to the decode result. The selected word line is charged by the decoder 101 to the HIGH state.

The WLTDSL precharge circuit 104 is formed by two P-channel MOS transistors. If the precharge signal is in the LOW state, the WLTD signal line 112 is precharged by the WLTDSL precharge circuit 104 to the HIGH state. The BL precharge circuit 105 is formed by three P-channel MOS transistors. If the precharge signal is in the LOW state, each of the bit lines 114 is precharged by the BL precharge circuit 105 to the HIGH state.

Each memory cell 103 contains a first N-channel MOS transistor 11, a second N-channel MOS transistor 12, and a data storage 13. The first and second transistors 11 and 12 of the memory cell 103 have their respective gates, these gates being connected in common to the word line 113 connected to that memory cell 103. The first transistor 11 has a drain that is connected to one of the bit lines 114, whereas the second transistor 12 has a drain that is connected to the other of the bit lines 114. The data storage 13 is sandwiched between the two transistors 11 and 12 sources. As fully shown in FIG. 2, the data storage 13 comprises two P-channel MOS transistors 14 and 16 arranged on the power source side and two N-channel MOS transistors 15 and 17 arranged on the ground side. If the decoder 101 selects one of the word lines 113, this allows the voltage of the selected word line to go HIGH. Both the first and second transistors 11 and 12 of the memory cell 103 connected to that selected word line are turned on. Then, data starts to be read out of the data storage 13 onto the bit lines 114. It is this point in time that the data storage 13 produces an electric potential difference between the bit lines 114 according to the read storage data.

Each WLTD circuit 102 has a third N-channel MOS transistor 21 and a fourth N-channel MOS transistor 22. The third and fourth transistors 21 and 22 of the WLTD circuit 102 have their respective gates, these gates being connected in common to the word line 113 connected to that WLTD circuit 102. The third transistor 21 has a drain that is connected to the WLTD signal line 112. The fourth transistor 22 has a drain that is connected to a source of the third transistor 21 and a source that is connected to the ground. If the decoder 101 selects one of the word lines 113, this allows the voltage of the selected word line 113 to go HIGH. The third and fourth transistors 21 and 22 of the WLTD circuit 102 that is connected to the selected word line 113 are turned on. The WLTD signal line 112 starts to be discharged.

The SESG circuit 106 generates a HIGH sense enable signal 125 when the voltage of the WLTD signal line 112 goes LOW.

The sense amplifier 107 amplifies an electric potential difference between the bit lines 114 when the enable signal 125 is in the HIGH state. The sense amplifier 107 is able to rapidly lower the voltage of one or the other of the bit lines 114 that starts to be discharged.

The read buffer 109, at the time of the data readout, outputs data, received onto the bit lines 114, to a data output terminal (DOUT) 123. The read buffer control circuit 111 makes the read buffer 109 operate when an output enable signal (OE), input at an output enable signal input terminal 122, is in the HIGH state.

The write buffer 108, at the time of writing data, outputs data, input at a data input terminal (DIN) 124, onto the bit lines 114. The write buffer control circuit 110 makes the write buffer 108 operate when a write enable signal (WE), input at a write enable signal input terminal 121, is in the HIGH state.

Figure 3:
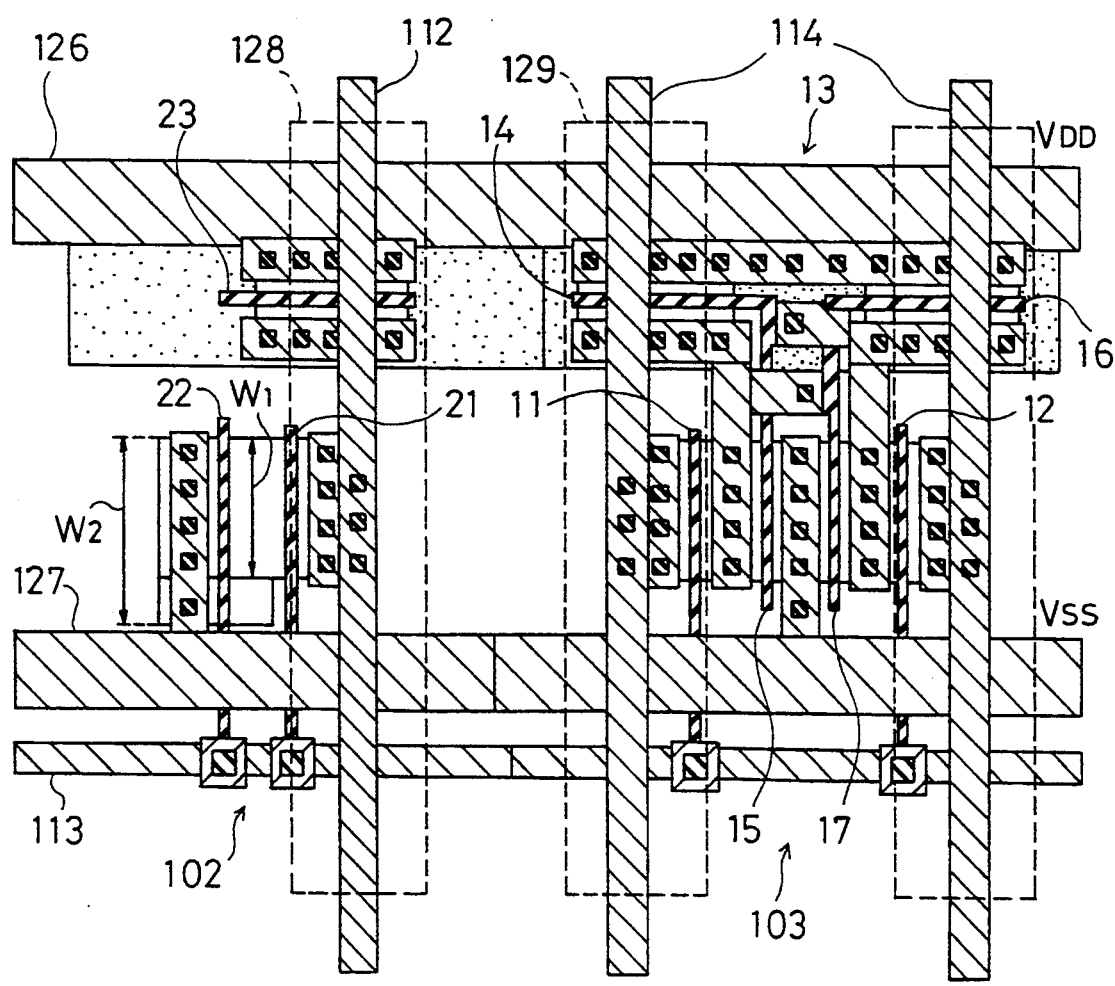
FIG. 3 is a top view showing a region containing one word line transition detection circuit and one memory cell of FIG. 1.

FIG. 3 shows a region containing one WLTD circuit 102 and one memory cell 103 of FIG. 1. In FIG. 3, a power supply line ($V_{DD}$) is indicated by reference numeral 126 and a ground line ($V_{SS}$) is indicated by reference numeral 127. Reference numerals 11, 12, 14, 15, 16, 17, 21, 22, and 23 respectively indicate gate locations of MOS transistors. The two P-channel MOS transistors 14,16 and the two N-channel MOS transistors 15, 17 forming the data storage 13 of the memory cell 103 are referred to as the first and second P-channel MOS transistors and the fifth and sixth N-channel MOS transistors.

As shown in FIG. 3, a first region 128 covering the periphery of the WLTD signal line 112 and a second region 129 covering the periphery of each bit line 114 are given the same layout and thus the WLTD signal line 112 and each bit line 114 bear the same adjunctive capacitance (i.e., the same parasitic capacitance). More specifically, the third N-channel MOS transistor 21 within the WLTD circuit 102 is identical in dimensions with the first and second N-channel MOS transistors 11 and 12 within the memory cell 103. $W_1$ indicates the gate width of the third N-channel MOS transistor 21. Underlying the WLTD signal line 112 is a dummy transistor 23. This dummy transistor 23 is a P-channel MOS transistor that is laid out in a corresponding manner to the first and second P-channel MOS transistors 14 and 16 of the memory cell 103 underlying the bit lines 114.

Referring still to FIG. 3, the description continues. $W_2$ indicates the gate width of the fourth N-channel MOS transistor 22 within the WLTD circuit 102. The gate width of the transistor 22 is determined in such a way that $W_2$ is greater than the gate width of the fifth and sixth N-channel MOS transistors 15 and 17, so that the driving capability of the transistor 22 is greater than the driving capability of the data storage 13 of the memory cell 103.

In the present embodiment, each bit line 114 is connected to two of the three P-channel MOS transistors within the BL precharge circuit 105. In view of such an arrangement, the WLTDSL precharge circuit 104 is given a redundant organization; that is, the WLTDSL precharge circuit 104, as described previously, is formed by two P-channel MOS transistors (see FIG. 1), and the WLTD signal line 112, too, is brought into connection with the two P-channel MOS transistors within the WLTDSL precharge circuit 104. This is to establish a perfect correspondence between the parasitic capacitance of the WLTD signal line 112 and the parasitic capacitance of each of the bit lines 114.

The data readout operation of the above-described SRAM is explained.

At the readout operation, the output enable signal is set at HIGH and the write enable signal is set at LOW. Then, the precharge signal at LOW is applied. As a result, all the N word lines 113 are discharged to LOW, the WLTD signal line 112 is precharged to HIGH, and the bit lines 114 are precharged to HIGH. Next, the precharge signal is made LOW so that the decoder 101 decodes an input address to select one of the N word lines 113. The voltage of the selected word line 113 is raised up to HIGH.

When the voltage of the word line 113 selected by the decoder 101 goes HIGH, the first and second transistors 11 and 12 within the memory cell 103 connected to the selected word line 13 are turned on. This causes the data storage 13 to begin lowering the voltage of one or the other of the bit lines 114.

Meanwhile, when the voltage of the word line 113 selected by the decoder 101 goes HIGH, the third and fourth transistors 21 and 22 within the WLTD circuit 102 connected to the selected word line 113 are turned on. As a result, the WLTD signal line 112 begins to be discharged. The sense enable signal 125 at HIGH is applied to the sense amplifier 107 when the voltage of the WLTD signal line 112 goes LOW.

Upon receiving the sense enable signal 125 at HIGH, the sense amplifier 107 rapidly lowers the voltage of one or the other of the bit lines 114, whichever starts going LOW. This allows data, read out of the memory cell 103 onto the bit lines 114, to be delivered to the DOUT terminal 123 at a high speed.

If the sense amplifier 107 is fed the sense enable signal 125 at HIGH before the voltage of one of the bit lines 114 starts going LOW, both of the bit lines 114 will be discharged by the sense amplifier 107 to LOW. As a result, wrong data readout occurs. Conversely, if the SESG circuit 106 generates the sense enable signal 125 too late, the sense amplifier 107 cannot exhibit its high-speed readout performance. In view of this, the delay time of the SESG circuit 106 is determined so that the best sense enable timing can be obtained.

Once the organization of the SESG circuit 106 is fixed in the above-described way, it becomes compatible with any memory capacity (i.e., the word count). This is because that the parasitic capacitance of the WLTD signal line 112 and the parasitic capacitance of each bit line 114 are the same; that is, the variation in capacitance of the WLTD signal line 112 and the variation in capacitance of each bit line 114, at the time when changing the word count, are the same. Unlike conventional techniques, the present embodiment eliminates the needs for sense enable timing correction required when changing the specification. Further, when using memory generators, it is not necessary to provide different types of leaf cells. According to the present embodiment, only one type of leaf cells is required. Less leaf cell data is required in layout design and memory generator programs can be simplified.

In the WLTD circuit 102, the fourth N-channel MOS transistor 22 cuts down the voltage of the WLTD signal line 112 to LOW through the third N-channel MOS transistor 21. In the memory cell 103, the fifth N-channel MOS transistor 15 has the function of cutting down the voltage of one of the bit lines 114 to LOW through the first N-channel MOS transistor 11, whereas the sixth N-channel MOS transistor 17 has the function of cutting down the voltage of the other of the bit lines 114 to LOW through the second N-channel MOS transistor 12. The third N-channel MOS transistor 21 has the same dimensions as the first and second N-channel MOS transistors 11 and 12. In addition, the gate width (i.e., the driving capability) of the fourth N-channel MOS transistor 22 is set greater than the driving capability of the fifth and sixth N-channel MOS transistors 15 and 17, whereby the voltage of the WLTD signal line 112 can more rapidly be cut down to LOW than that of any one of the bit lines 114, without upsetting the balance of the parasitic capacitance of the WLTD signal line 112 to that of each bit line 114. This allows for ease in designing the organization of the SESG circuit 106 capable of setting the best sense enable timing.

Additionally, the present invention may be applicable to a case where a memory cell is read and the data read is placed onto a single bit line.

The invention claimed is:

1. A semiconductor memory comprising:
    a plurality of word lines,
    a bit line,
    a single word line transition detection signal line,
    a plurality of memory cells respectively associated with said word lines, each of said memory cells producing an electric potential on said bit line according to stored data when an associated word line is selected from said word lines,
    a plurality of word line transition detection circuits, respectively associated with said word lines, each of said word line transition detection circuits driving said word line transition detection signal line when an associated word line is selected from said word lines,
    a sense enable signal generation circuit for generating a sense enable signal when said word line transition detection signal line is driven, and a sense amplifier for amplifying an electric potential on said bit line when said sense enable signal generation circuit generates a sense enable signal, wherein said bit line and said word line transition detection signal line have the same parasitic capacitance.

2. The semiconductor memory of claim 1, wherein each of said memory cells is coupled to said bit line and each of said word line transition detection circuits is coupled to said word line transition detection signal line, each of said memory cells being coupled to said bit line so as to form a layout pattern which is identical to the layout pattern formed by the coupling of each of said word line transition detection circuits to said word line transition detection signal line.

3. A semiconductor memory comprising:

a plurality of word lines, a pair of bit lines, a single word line transition detection signal line, a plurality of memory cells respectively associated with said word lines, each of said memory cells producing an electric potential difference between said bit lines according to stored data when an associated word line is selected from said word lines, a plurality of word line transition detection circuits, respectively associated with said word lines, each of said word line transition detection circuits driving said word line transition detection signal line when an associated word line is selected from said word lines, a sense enable signal generation circuit for generating a sense enable signal when said word line transition detection signal line is driven, and a sense amplifier for amplifying an electric potential difference between said bit lines when said sense enable signal generation circuit generates a sense enable signal, wherein each of said bit lines and said word line transition detection signal line have the same parasitic capacitance.

4. The semiconductor memory of claim 3 wherein each of said memory cells comprises:

a first MOS transistor having a gate connected to an associated word line and a drain connected to one of said bit lines, a second MOS transistor having a gate connected to the same word line as said first MOS transistor's gate and a drain connected to the other of said bit lines, and a data storage sandwiched between a source of said first MOS transistor and a source of said second MOS transistor.

5. The semiconductor memory of claim 4, wherein each of said word line transition detection circuits comprises:

a third MOS transistor having a gate connected to an associated word line and a drain connected to said word line transition detection signal line, and a fourth MOS transistor having a gate connected to the same word line as said third MOS transistor's gate, a drain connected to a source of said third MOS transistor, and a source connected to a ground, wherein said third MOS transistor has identical dimensions as said first and second MOS transistors.

6. The semiconductor memory of claim 3, wherein the width of the gate of said fourth MOS transistor is greater than the width of the gate of MOS transistors forming said data storage so that said fourth MOS transistor comprises a driving capability which is higher than the driving capability of said data storage.

7. The semiconductor memory of claim 3, wherein each of said memory cells is coupled to said bit lines and each of said word line transition detection circuits is coupled to said word line transition detection signal line, each of said memory cells being coupled to said bit lines so as to form a layout pattern which is identical to the layout pattern formed by the coupling of each of said word line transition detection circuits to said word line transition detection signal line.

8. A method for use in semiconductor memory layout design comprising:

a step of creating, respectively in the form of a leaf cell of one type, internal organizations of: (a) a memory cell for producing an electric potential on a bit line according to stored data when a word line is selected, (b) a word line transition detection circuit for driving a word line transition detection signal line when the word line is selected, (c) a sense enable signal generation circuit for generating a sense enable signal when the word line transition detection circuit is driven, (d) and a sense amplifier for amplifying the electric potential on the bit line when the sense enable signal is generated, a step of coupling the memory cell to the bit line thereby forming a first layout pattern, and a step of coupling the word line transition detection circuit to the word line transition detection signal line thereby forming a second layout pattern, wherein said first layout pattern and said second layout pattern are identical to one another.

* * * * *